United States Patent
Ahmed et al.

(10) Patent No.: US 9,748,902 B2
(45) Date of Patent: Aug. 29, 2017

(54) PHASE CORRECTION IN A DOHERTY POWER AMPLIFIER

(71) Applicants: Maruf Ahmed, Tempe, AZ (US); Joseph Staudinger, Gilbert, AZ (US)

(72) Inventors: Maruf Ahmed, Tempe, AZ (US); Joseph Staudinger, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/714,036

(22) Filed: May 15, 2015

(65) Prior Publication Data
US 2016/0336903 A1 Nov. 17, 2016

(51) Int. Cl.
| H03F 1/02 | (2006.01) |
| H03F 3/21 | (2006.01) |
| H03F 3/19 | (2006.01) |
| H03F 3/68 | (2006.01) |
| H03F 1/56 | (2006.01) |
| H03F 3/195 | (2006.01) |

(52) U.S. Cl.
CPC ........... *H03F 1/0288* (2013.01); *H03F 1/565* (2013.01); *H03F 3/19* (2013.01); *H03F 3/195* (2013.01); *H03F 3/211* (2013.01); *H03F 2200/171* (2013.01); *H03F 2200/387* (2013.01); *H03F 2200/391* (2013.01); *H03F 2200/451* (2013.01); *H03F 2203/21106* (2013.01)

(58) Field of Classification Search
USPC .................. 330/295, 124 R, 84, 286, 53
See application file for complete search history.

(56) References Cited

U.S. PATENT DOCUMENTS

| 6,262,629 | B1 | 7/2001 | Stengel et al. | |
| 7,521,995 | B1 | 4/2009 | Krvavac | |
| 7,961,048 | B2 * | 6/2011 | Oakley | H03F 1/0288 |
| | | | | 330/124 R |
| 8,022,760 | B2 | 9/2011 | Gajadharsing et al. | |
| 8,576,010 | B2 * | 11/2013 | Yanduru | H03F 1/0288 |
| | | | | 330/124 R |
| 8,593,219 | B1 | 11/2013 | Root | |

(Continued)

FOREIGN PATENT DOCUMENTS

| DE | 102013111936 A1 | 4/2014 |
| EP | 2713505 A2 | 4/2014 |

OTHER PUBLICATIONS

Extended Search Report for the International application No. EP 16167641.6 dated Sep. 21, 2016.

*Primary Examiner* — Hieu Nguyen (57) ABSTRACT

In various embodiments, a semiconductor package includes a carrier amplifier connected to a first output of a power divider, and a first output matching network connected to the carrier amplifier and an output combining node. The first output matching network exhibits a phase delay during operation of the carrier amplifier. The semiconductor package includes a phase advance network connected to the first output matching network. The phase advance network is configured to offset at least a portion of the phase delay of the first output matching network. The semiconductor package includes a peaking amplifier connected to a second output of the power divider and the output combining node, and a second output matching network connected to the peaking amplifier.

16 Claims, 7 Drawing Sheets

(56) References Cited

U.S. PATENT DOCUMENTS

| | | | |
|---|---|---|---|
| 8,779,856 B2* | 7/2014 | Wilson | H03F 1/0288 330/124 R |
| 2009/0167438 A1 | 7/2009 | Yang et al. | |
| 2013/0093534 A1 | 4/2013 | Mei | |
| 2013/0194023 A1* | 8/2013 | Ahmed | G06G 7/10 327/360 |
| 2013/0293309 A1 | 11/2013 | Tamura | |
| 2014/0240039 A1 | 8/2014 | Pengelly | |

* cited by examiner

PHASE CORRECTION IN A DOHERTY POWER AMPLIFIER

BACKGROUND

Field of Use

The present disclosure relates generally to power amplifiers, and more specifically, to power amplifiers utilizing phase advancement to achieve a desired phase correction on one or more paths of the amplifier.

Description of the Related Art

Wireless communication systems often employ power amplifiers for increasing the power of a high frequency signal. In a wireless communication system, a power amplifier is usually the last amplifier in a transmission chain (i.e., the output stage). High gain, high linearity, stability, and a high level of efficiency—the ratio of radio frequency (RF) output power to direct current (DC) power—are characteristics of an ideal amplifier.

In general, a high frequency power amplifier operates at maximum power efficiency when the power amplifier transmits peak output power. However, power efficiency tends to worsen as output power decreases. Recently, Doherty power amplifier architectures have been the focus of attention not only for base stations, but also for mobile terminals because of the architecture's high power-added efficiency.

A Doherty power amplifier includes two or more amplifiers, such as a carrier amplifier and a peaking amplifier. These amplifiers can be connected in parallel with their outputs joined by an offset transmission line, which performs impedance transformation. The peaking amplifier delivers current as the carrier amplifier saturates, thereby reducing the impedance seen at the output of the carrier amplifier. Thus, the carrier amplifier delivers more current to the load while the carrier amplifier is saturated because of a "load-pulling" effect. Since the carrier amplifier remains close to saturation, a Doherty power amplifier is able to transmit peak output power so that the total efficiency of the system remains relatively high.

BRIEF DESCRIPTION OF THE DRAWINGS

The present disclosure is illustrated by way of examples and embodiments and is not limited by the accompanying figures, in which like reference numbers indicate similar elements. For simplicity and clarity of illustration, the drawing figures illustrate the general manner of construction, and details of well-known features and techniques may be omitted to avoid unnecessarily obscuring the invention. Elements in the figures are illustrated for simplicity and clarity and have not been necessarily drawn to scale. In fact, the dimensions of some of the elements or regions in the figures may be exaggerated relative to other elements or regions to better understand embodiments of the apparatus. The figures together with the detailed description are incorporated and form part of the specification and serve to further illustrate examples, embodiments and the like, and explain various principles and advantages, in accordance with the present disclosure, where.

DETAILED DESCRIPTION

The following detailed description is exemplary in nature and is not intended to limit the invention or the application and uses of the same. Furthermore, there is no intention to be bound by any expressed or implied theory presented in the preceding technical field, background, or the following detailed description.

The present embodiments may be used to improve the performance and reduce the package size of packaged power amplifiers. The power amplifiers may be used in base station power amplifiers, cell phones, other portable devices, and other apparatus or devices dependent upon semiconductor packages, where low cost, low weight, and small volume may be desired. The embodiments described herein may provide enhanced phase correction in either or both of the carrier path and peaking path amplifiers of a Doherty amplifier. The embodiments may also provide enhanced phase correction in multiple peaking paths of a Doherty amplifier having three or more amplification paths.

In many applications, Doherty amplifiers require output matching circuitry that provides impedance inversion and matching between one or more of the device's amplifiers and the device's output combining node. To achieve a desired phase shift through the output matching circuitry, the electrical length of the output matching circuitry should be equal to be n*λ/4 where n is a positive odd integer and λ is the wavelength of the signal outputted by the amplifiers. In practice, however, the minimum circuit length (i.e., where n is equal to 1) is difficult to achieve because the length of the output matching circuitry is often greater than λ/4. Consequently, in conventional designs, transmission lines are often added to the output matching circuitry in order to meet circuit length constraints.

Figure 1:
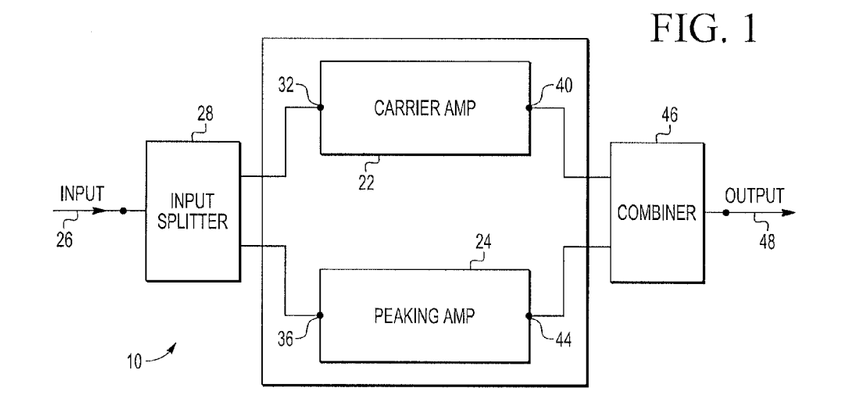
FIG. 1 is a block diagram of an exemplary embodiment of a Doherty power amplifier in a semiconductor package.

FIG. 1 shows a simplified block diagram of a Doherty power amplifier 10 that includes a carrier amplifier 22 and a peaking amplifier 24 connected in parallel. The carrier amplifier 22 and peaking amplifier 24 are contained in a semiconductor package 20. A high frequency input signal 26 is divided into two signals by an input splitter 28, which may apply a phase delay to one or both of the signals (e.g., resulting in a 90 degree phase difference between the two signals). The input splitter 28 may be coupled to a printed circuit board (not illustrated) or other substrate to which the semiconductor package 20 is coupled, or the input splitter 28 may be included within the semiconductor package 20. One of the resulting input signals is applied to a first input 32 of the carrier amplifier 22, and the other input signal is applied to a second input 36 of the peaking amplifier 24. The carrier amplifier 22 produces a first output signal at a first output 40 and the peaking amplifier 24 produces a second output signal at a second output 44. In a Doherty configuration, the first input 32 and the first output 40 may constitute a gate terminal and a drain terminal of the carrier amplifier 22, respectively; and the second input 36 and the second output 44 may constitute a gate terminal and a drain terminal of the peaking amplifier 24, respectively. The first and second output signals are combined through an output combiner 46 to produce a combined high frequency output signal 48. The output combiner 46 may be coupled to a printed circuit board (not illustrated) or other substrate to which the semiconductor package 20 is coupled, or the output combiner 46 may be included within the semiconductor package 20. Those skilled in the art will recognize that a Doherty power amplifier semiconductor package typically includes additional electronic devices and circuitry not shown herein for simplicity of illustration. In addition, a Doherty power amplifier may include more than two signal paths, in other embodiments. For example, a Doherty power amplifier may include one carrier amplifier and multiple peaking amplifiers, in some embodiments.

In one embodiment, the carrier amplifier 22 is configured to be active for an entire range of output powers of Doherty power amplifier 10. Peaking amplifier 24 is configured to turn on only when the carrier amplifier 22 saturates. Output combiner 46, operating to combine the high frequency first output signal from the carrier amplifier 22 with the high frequency second output signal from peaking amplifier 24, may include a quarter-wave impedance inverter. The quarter-wave impedance inverter can add a ninety degree lag to the output signal from the carrier amplifier 22 or the peaking amplifier 24 in order to compensate for the phase delay added by the input splitter to the signal provided to either the peaking amplifier 24 or the carrier amplifier. The phase of the signal provided to peaking amplifier 24 is typically designed to lag that of the carrier amplifier 22 by ninety degrees so that the two output signals add in-phase when the output signals are combined at the output of output combiner 46 to form combined output signal 48. Alternatively, the phase of the signal provided to the carrier amplifier 22 may be designed to lag that of the peaking amplifier 24 (e.g., in an inverted Doherty amplifier configuration).

In the exemplary circuit in FIG. 1, each of the carrier amplifier 22 and peaking amplifier 24 may include a number of active and passive electrical elements. For example, the carrier amplifier 22 may include a first input impedance matching network (e.g., including one or more capacitors and inductors) that couples the first input 32 to a control terminal of a first transistor (e.g., an LDMOS or other type of transistor). The first transistor applies the appropriate amplification to the first input signal received at that input. An output of the first transistor can be connected to a first output impedance matching network (e.g., also including one or more capacitors and inductors), which in turn is connected to output 40. The first impedance matching network can operate to condition the input first signal that is amplified by the first transistor. Similarly, the peaking amplifier 24 can include a second input impedance matching network (e.g., including one or more capacitors and inductors) coupling the second input 36 to the control terminal of a second transistor (e.g., an LDMOS or other type of transistor). The second transistor can then apply the appropriate amplification to the second input signal received at the second input. An output of the second transistor can be connected to a second output impedance matching network (e.g., including one or more capacitors and inductors), which in turn is connected to output 44. The second impedance matching network can operate to condition the input second signal that is amplified by the second transistor. Those skilled in the art will recognize that the carrier amplifier 22 and peaking amplifier 24 may include additional electronic components not shown herein for simplicity of illustration.

Figure 2:
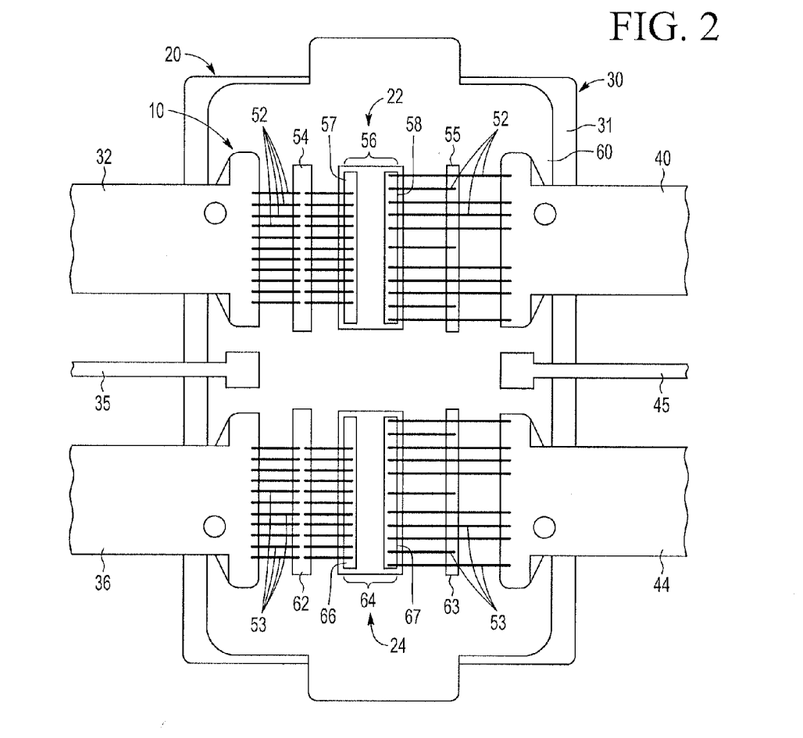
FIG. 2 is a top schematic view of components of the carrier and peaking amplifiers for the exemplary Doherty power amplifier in the semiconductor package.

With reference to the semiconductor package 20 in FIG. 2, the separate electrical components forming the carrier amplifier 22 and the peaking amplifier 24 are components, such as capacitors 54 and 55 and transistor 56 (having gate pad 57 and first current carrying terminal pad 58 (e.g., a drain or source pad)) fabricated on and/or subsequently mounted to a common (i.e., single) substrate 30, particularly a surface of a ground plane 60, for example. A second current carrying terminal (not shown) of transistor 56 can be electrically coupled to ground plane 60. Substrate 30 and ground plane 60 may be distinct features of semiconductor package 20, or substrate 30 and ground plane 60 may be a single feature (e.g., an embodiment may include a solid, conductive flange to which the components forming the carrier amplifier 22 and the peaking amplifier 24 are directly mounted). Similarly, the peaking amplifier 24 includes a number of electrical devices, such as capacitors 62 and 63 and transistor 64 (having gate pad 66 and first current carrying terminal pad 67 (e.g., a drain or source pad)) fabricated on or subsequently mounted to the surface of the ground plane 60 located on a surface 31 of the substrate 30. A second current carrying terminal (not shown) of transistor 64 is electrically coupled to ground plane 60. Capacitors 54, 55, 62 and 63 may be, for example, metal-oxide-semiconductor (MOS) capacitors or other types of capacitors, each with one terminal electrically coupled to ground plane 60. The ground plane 60 is electrically connected to the first and second ground connectors 35 and 45, in an embodiment. The carrier amplifier 22 and the peaking amplifier 24 respectively form first and second circuits on the substrate 30 and combined form the electronic circuitry within the semiconductor package 20.

In a practical application, one or more of the signal paths (e.g., between inputs, outputs, capacitors, transistors and other components) of the carrier amplifier 22 are established using wire bonds 52. Likewise, wire bonds 53 may be used to establish one or more of the signal paths for the peaking amplifier 24.

A first ground connector 35 can be located in between the first and second inputs 32 and 36 on one side of the semiconductor package 20 and a second ground connector 45 is located in between the first and second outputs 40 and 44 on the opposite side of the semiconductor package, in an embodiment. The first and second ground connectors 35 and 45 project outward from the exterior surfaces of the semiconductor package 20.

Figure 3:
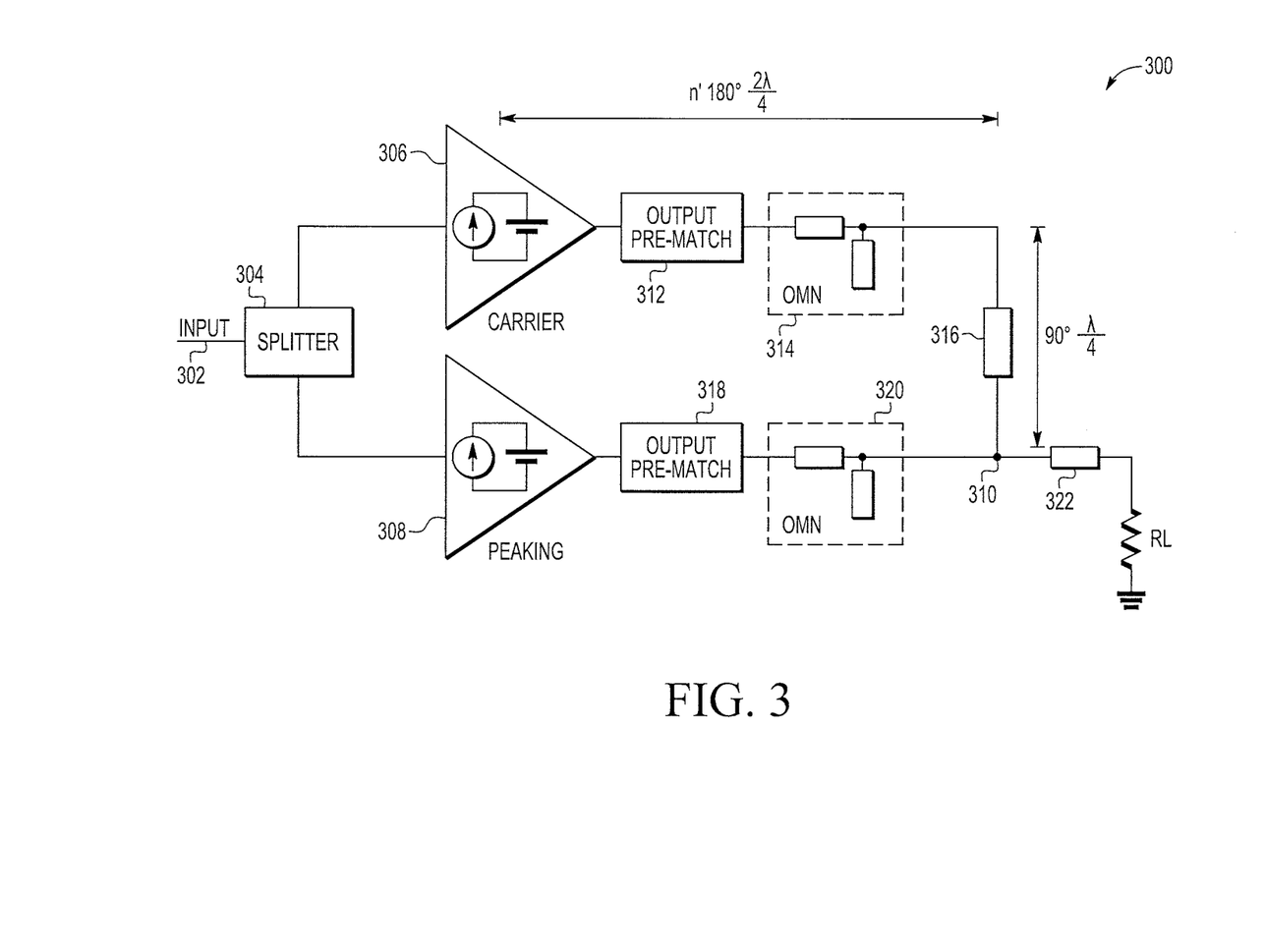
FIG. 3 is a block diagram illustrating a conventional Doherty amplifier architecture and illustrating total phase shift between the device's carrier amplifier and summing node.

FIG. 3 is a block diagram illustrating a conventional Doherty amplifier architecture and showing total phase shift between the device's carrier amplifier and output node. As illustrated, Doherty amplifier 300 includes, at input 302, splitter 304. Splitter 304 may include a power divider with an input for receiving an input radio frequency signal, and first and second divider outputs. When connected to a symmetrical Doherty amplifier, splitter 304 may divide or split an input signal received at input 302 into two signals that are very similar with, in some embodiments, equal power. In other cases, though, splitter 304 may output signals having unequal power.

The outputs of splitter 304 are connected to carrier amplifier 306 and peaking amplifier 308. As will be appreciated by those of ordinary skill based on the description herein, carrier amplifier 306 and peaking amplifier 308 may include one or more stages of relatively low power level amplification and relatively high power level amplification. In some embodiments, carrier amplifier 306 may be implemented by a network of electrical components, in which case, carrier amplifier 306 may include an active device, which is often modeled as a current source (depicted on FIG. 3 as a current source within carrier amplifier 306). Peaking amplifier 308 may be similarly implemented. The output of carrier amplifier 306 is connected to output node 310 through output pre-match circuit 312, output matching network 314 and phase shift element 316. The output of peaking amplifier 308 is connected to output node 310 through output pre-match circuit 318 and output matching network 320. An impedance network, represented by element 322 operates to present the proper load impedances to each of carrier amplifier 306 and peaking amplifier 308. In a real-world implementation, element 322 may be replaced by a suitably configured transmission line or impedance transformer and output network, where the transmission line or impedance transformer has an impedance selected to match the impedance of amplifier 300 to the desired load.

Figure 4:
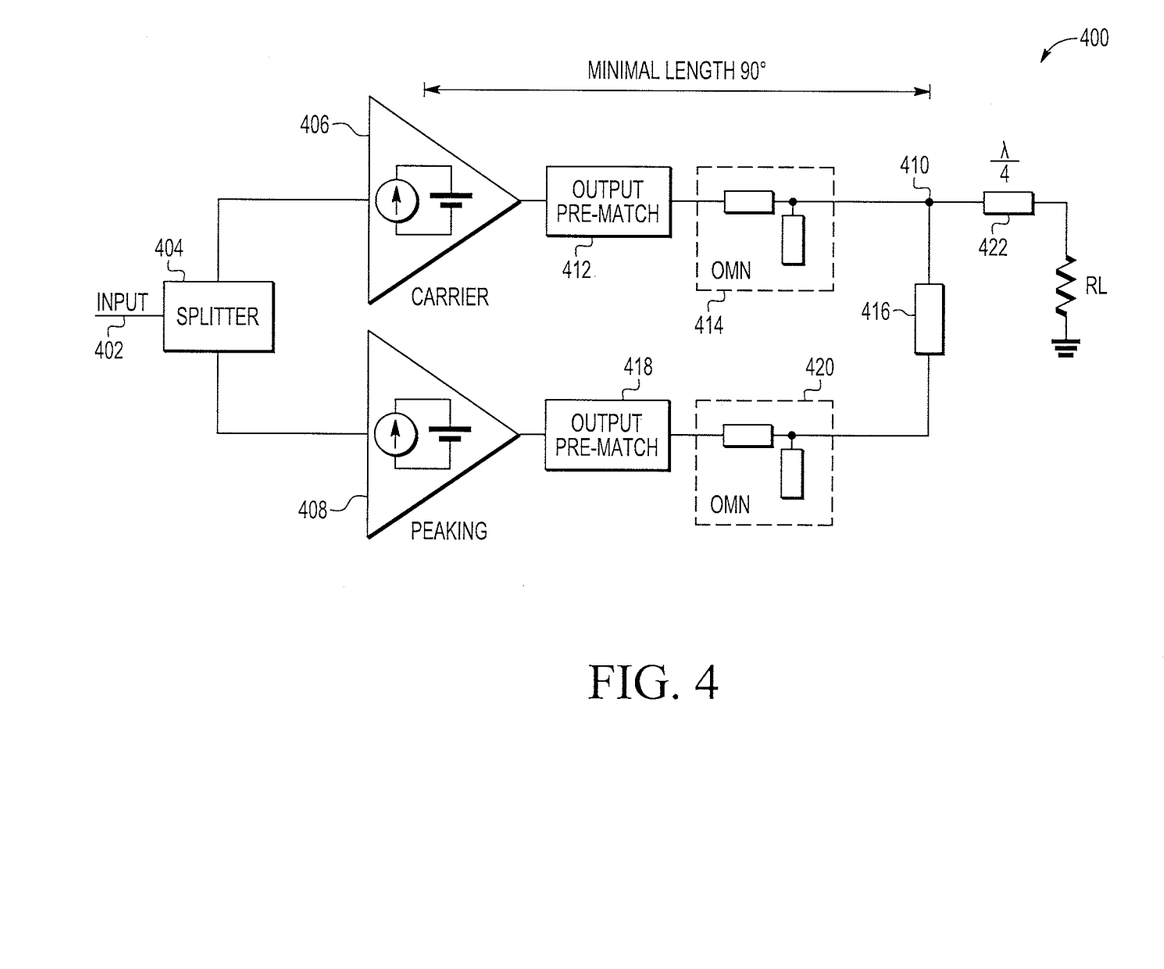
FIG. 4 is a block diagram illustrating the amplifier of FIG. 3 with components rearranged in an inverted Doherty amplifier architecture.

In contrast to FIG. 3, FIG. 4 shows the amplifier of FIG. 3 with components rearranged in an inverted Doherty amplifier architecture. In FIG. 4, the inverted Doherty amplifier 400 includes, at input 402, splitter 404. The outputs of splitter 404 are connected to carrier amplifier 406 and peaking amplifier 408. In some embodiments, carrier amplifier 406 may be implemented by a network of electrical components, in which case, carrier amplifier 406 may include an active device, which is often modeled as a current source (depicted on FIG. 4 as a current source within carrier amplifier 406). Peaking amplifier 408 can be similarly implemented. The output of carrier amplifier 406 is connected to output node 410 through output pre-match circuit 412 and output matching network 414. The output of peaking amplifier 408 is connected to output node 410 through output pre-match circuit 418, output matching network 420, and phase shift element 416. An impedance network, represented by element 422 operates to present the proper load impedances to each of carrier amplifier 406 and peaking amplifier 408.

In Doherty amplifier design, the phase length from the current source of the amplifier's carrier amplifier (e.g., carrier amplifier 306 or carrier amplifier 406) to the amplifier's output node should have a length of n*λ/4 where n is odd. In an ideal amplifier, the phase length is as short as possible, or λ/4. By reducing the phase length of an amplifier path, that path requires less physical size and expense to implement and also operates more efficiently.

In conventional Doherty amplifiers employing conventional architectures, however, the phase length of the carrier path is usually 3*λ/4 because the physical construction of the output pre-match circuit 312 and output matching network 314 results in a phase length through those components greater than λ/4—those components simply introduce too much phase length into their respective amplifier paths. Consequently, additional transmission lines must be added to the carrier amplifier path to increase the phase length up to the next suitable length, which is 3*λ/4, or greater.

In the present disclosure, phase advance networks are installed into one or more of the paths of a multipath amplifier, such as a Doherty amplifier, where the phase advance networks are configured to effectively reduce the phase length of their corresponding amplifier path (i.e., the amplifier path into which the phase advance network is installed). In various embodiments, the phase advance networks may be implemented to pass high-frequency signals selected to offset the path's phase delay characteristics. This results in the phase advance network negating some of the phase delay that is generated by the corresponding path's output pre-match and output matching circuitry, resulting in an overall reduction in the phase length of the amplifier path containing the phase advance network. With sufficient reduction, phase lengths of λ/4 may be achievable, reducing the need for additional transmission lines configured to increase the phase length of the amplifier path up to 3*λ/4. This can reduce the overall size of the corresponding amplifier package. In addition to reducing the phase length of the corresponding amplifier path, the present phase advance network, being a high pass filter, may reduce the overall group delay of the corresponding path. Group delay describes a rate of change of phase with respect to frequency, an increase in which reduces the bandwidth capabilities of an amplifier. Accordingly, reductions in group delay of an amplifier path can result in improved overall bandwidth for the amplifier.

In various embodiments, therefore, the present phase advance network can be utilized to effectively reduce the path length of a carrier path of a conventionally-configured Doherty amplifier. With sufficient reduction, the length of the carrier path of a conventionally configured Doherty amplifier can be made equal to that of a carrier path of an inverted Doherty amplifier.

Figure 5:
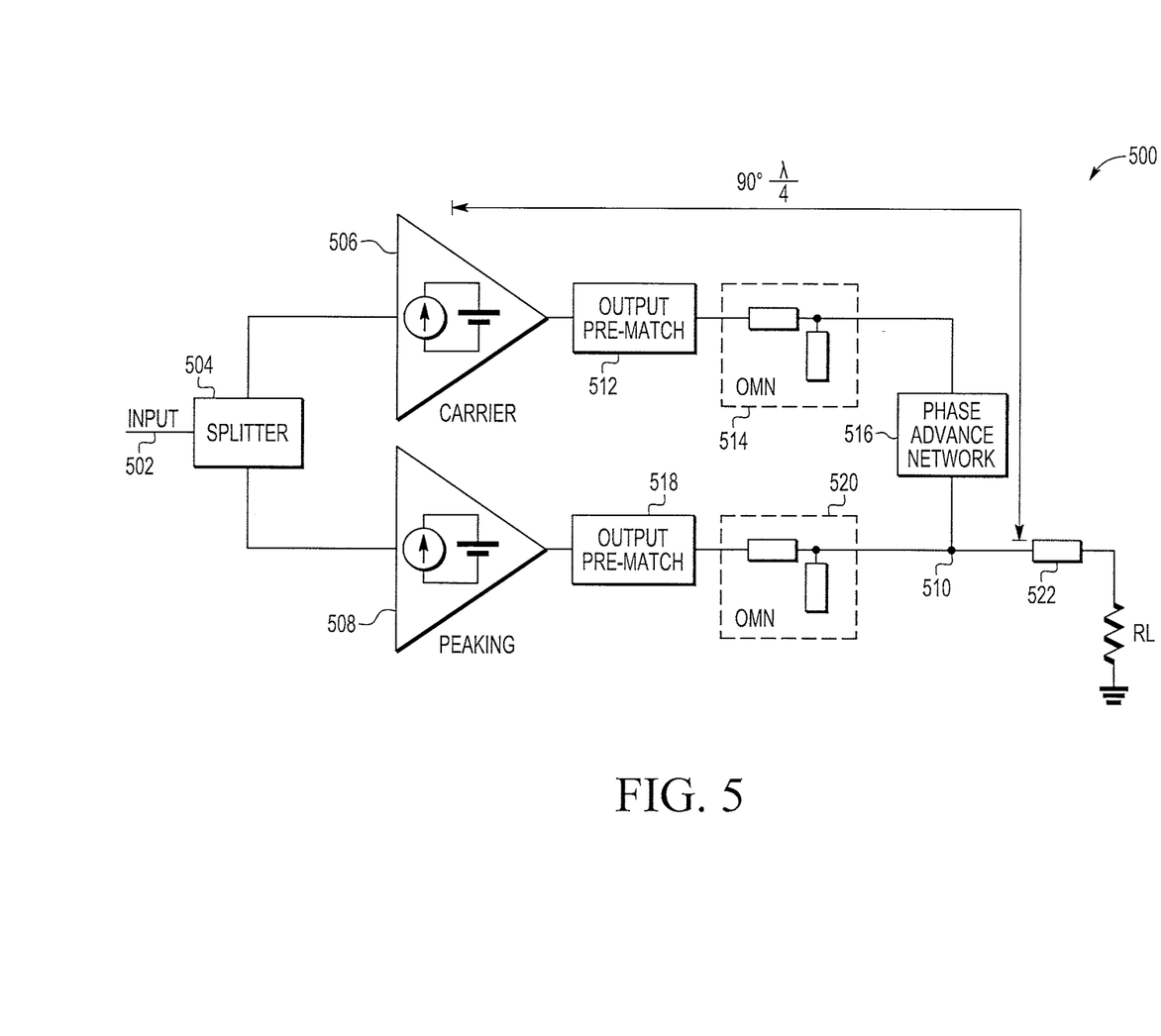
FIG. 5 is a block diagram showing a Doherty amplifier incorporating a phase advance network configured to mitigate a phase delay occurring in at least one path of the Doherty amplifier.

FIG. 5 is a block diagram showing a Doherty amplifier incorporating a phase advance network configured to mitigate a phase delay occurring in at least one path of the Doherty amplifier. Amplifier 500 includes an input 502 connected to splitter 504. Splitter 504 supplies input signals to both carrier amplifier 506 on a carrier path and peaking amplifier 508 on a peaking path of amplifier 500. Carrier amplifier 506 is connected to output node 510 through output pre-match circuit 512, output matching network 514, and phase advance network 516. Peaking amplifier 508 is connected to output node 510 through output pre-match circuit 518 and output matching network 520. An impedance network, represented by element 522 operates to present the proper load impedances to each of carrier amplifier 406 and peaking amplifier 408.

Phase advance network 516 represents an electrical network configured to pass high-frequency signals, where the high-frequency signal passed by the phase advance network 516 is selected to offset a phase delay of the path on which phase advance network is installed. For example, if the phase delay introduced to the carrier path of amplifier 500 by output pre-match circuit 512 and output matching network 514 is 135 degrees, phase advance network 516 may be configured to introduce a phase advance of 45 degrees so as to offset that phase delay and achieve a total phase delay of 90 degrees—the optimum phase delay for a carrier path of a conventionally configured Doherty amplifier.

In the example shown, amplifier 500 depicts phase advance network 516 implemented on the carrier path of amplifier 500. In other embodiments, similar phase advance networks could be implemented on the peaking path of amplifier 500 to reduce or mitigate phase delay effects that may occur on the peaking path. In such an embodiment, a phase advance circuit could be connected to the peaking amplifier path between elements 520 and 510. The phase advance network would be configured to compensate for excessive delay introduced by elements 518 and 520 such that the total phase delay from the peaking amplifier 508 to node 510 is m λ/4, where m is an even integer, i.e., m=0, 2, 4, and so on. Such an embodiment may be useful to minimize the size and area associated with the peaking amplifier, and Doherty amplifier in general. Similar techniques may be used to implement phase advance networks on one or more of the paths in Doherty amplifiers consisting of multiple (more than one) carrier and/or peaking amplifiers.

Phase advance network 516 is generally implemented as a second order or greater high pass filter configured to mitigate excessive phase delays exhibited by the corresponding matching network located on the same amplifier path. The filters can be implemented as shunt-inductive or shunt-capacitive networks of varying order, as described below.

Figure 6A:
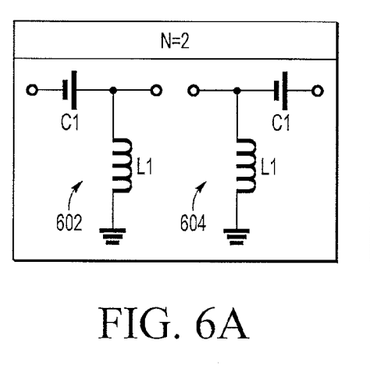
FIGS. 6A-6C are circuit diagrams illustrating high-pass filters of varying order.

FIG. 6A depicts two potential second order high-pass filters 602 and 604 configured to may be utilized within phase advance network 516. As illustrated, each filter 602 and 604 relies upon an inductor and capacitor to implement its high-pass functionality. In some embodiments, the second order high pass filters 602 and 604 can be configured to achieve a phase advance of approximately 20 degrees.

Figure 6B:
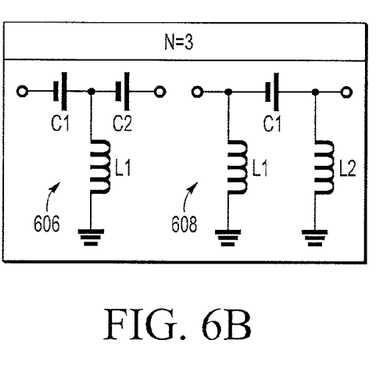

FIG. 6B depicts two potential third order high-pass filters 606 and 608 configured to may be utilized within phase advance network 516. As illustrated, each filter 606 and 608 relies upon combinations of inductors and capacitors to implement its high-pass functionality. In some embodiments, the third order high pass filters 606 and 608 can be configured to achieve a phase advance of approximately 50 degrees.

Figure 6C:
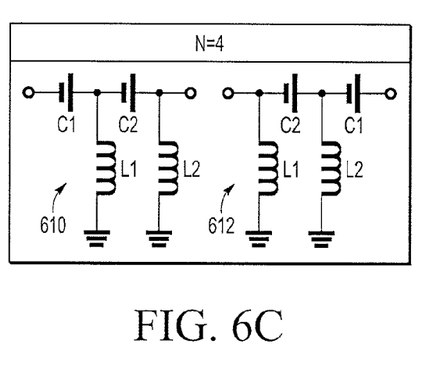

FIG. 6C depicts two potential fourth order high-pass filters 610 and 612 configured to may be utilized within phase advance network 516. As illustrated, each filter 610 and 612 relies upon combinations of inductors and capacitors to implement its high-pass functionality. In some embodiments, the fourth order high pass filters 610 and 612 can be configured to achieve a phase advance of approximately 75 degrees or more.

The following Table 1 shows estimated phase shift achievable with filter network of varying order. For the majority of applications, filters having orders up to 4 will be sufficient for implementation within the phase advance network. Filters having orders greater than 4, though useful, may be difficult to implement given practical and physical constraints of some amplifier device. In the case that higher order filters are implemented, estimated phase shifts of 100 degrees (5th order), 130 degrees (6th order), 155 degrees (7th order), and 180 degrees (8th order) may, in some implementations, be achievable.

TABLE 1

| Order of Filter | Estimated Phase Shift |
|---|---|
| 2 | 20 degrees |
| 3 | 50 degrees |
| 4 | 75 degrees |

Generally, as the order of the network making up the high-pass filter increases, the amount of phase advance achievable by the filter may also increase. As such, the order of the high-pass filter implemented within the phase advance network may be at least partially determined by the desired phase advance for a particular system implementation.

In other embodiments, high pass filters of different orders than those shown in FIGS. 6A-6C may be utilized within phase advance network 516 to provide the desired functionality. In selecting a particular filter configuration, there may be a trade-off between the phase shift desired, the complexity of the design, and the cost of implementing the design within a Doherty amplifier device. Additionally, higher-order filters may occupy a larger space, resulting in a trade-off between phase shift correction achieved and device size.

When designing a high-pass filter to be utilized within phase advance network 516, the filter design may be derived using established filter theory. Although any suitable mechanism may be utilized to configure the filter of phase advance network 516, in one application, it is possible to design an initial filter using a low pass prototype filter (e.g., with a Chebychev response where $g_0=1$ and $\omega_0=1$) and then convert that low pass prototype filter into a corresponding high-pass filter suitable for use in the present phase advance network 516.

Figure 7:
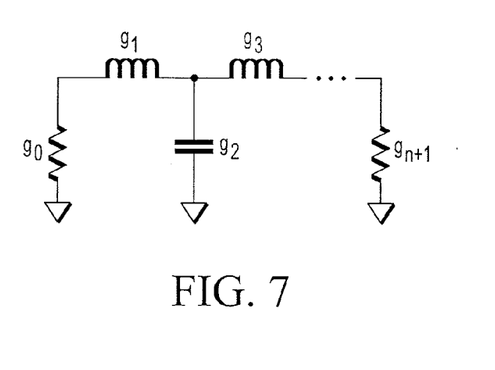
FIG. 7 depicts an $n^{th}$ order network operating as a low-pass prototype network where n is equal to 3.

To begin, FIG. 7 depicts an $n^{th}$ order network operating as a low-pass prototype network where the filter order n is equal to 3. Again, the order of the prototype filter can be selected based upon the rough estimates of phase shift capabilities of various order filters described above. When selecting the order of the prototype filter, it can be important to consider the bandwidth of the filter. If the filter has insufficient bandwidth, some of the benefits of the filter (e.g., reductions in group delay) may be negated. As such, the filter design may be selected to provide sufficient bandwidth to allow some headroom. For example, by selecting a third order filter to achieve a 50 degree phase shift, such a filter could provide 20-25% bandwidth (e.g., where the filter's cutoff frequency is 773 MHz for a 1 GHz center frequency amplifier). Such a filter would operate away from the band edge of the amplifier.

Once suitable component values are determined for the low-pass prototype, the values can be converted or transformed into suitable values for a corresponding high-pass filter arranged to generate the desired phase shift. The low-pass prototype, therefore, provides a basis upon which values for the high-pass filter can be calculated. In this example, the two impedances $g_0$ and $g_{n+1}$ represent the terminating impedances of the network and are not part of the present analysis.

When designing the filter, in a first step, given a desired phase shift or phase advance, the order (n) of the filter is estimated. The amount of desired phase advance can be determined either through simulation or empirically. In the former, the amount of phase advance required can be determined using circuit simulation methods which model and simulate the phase delay in the elements between carrier amplifier and summing node. In a simplistic case, the transistor at the output side of the carrier amplifier can be modeled as a current source with parasitic capacitance Cds. With this model, the output pre-match and output matching network circuitry can be simulated to identify phase shift at the output node. In the latter, the phase advance can be determined through empirical methods, such as tuning on circuit boards coupled with measurements. For example, the order could be selected based upon the table of estimated phase shift achievable for $n^{th}$ order filters provided above. Once selected, a value k is defined as having the integer values from 1 to n (see equation 1).

$$k=1 \ldots n \qquad \text{Eq. 1}$$

With k defined, values $a_k$, $\beta$, $\gamma$, $b_k$ can be calculated according to Equations 2, 3, 4, and 5, shown below. In Equation 3, the value $L_{AR}$ is defined as the pass-band ripple for a Chebychev network, an unconstrained parameter that can be selected based upon a desired design characteristic.

$$a_k = \sin\left[\frac{2 \cdot k - 1}{n} \cdot \frac{\pi}{2}\right] \qquad \text{Eq. 2}$$

$$\beta = \ln\left[\coth\left(\frac{L_{AR}}{17.37}\right)\right] \qquad \text{Eq. 3}$$

$$\gamma = \sinh\left(\frac{\beta}{2 \cdot n}\right) \qquad \text{Eq. 4}$$

$$b_k = \gamma^2 + \sin^2\left[\frac{k \cdot \pi}{n}\right] \qquad \text{Eq. 5}$$

With the values $a_k$, $\beta$, $\gamma$, $b_k$ determined, component values for the low pass filter network can be determined. First, the value for the $g_0$ element is set to a value of 1, as shown in Equation 6.

$$g_0 = 1 \qquad \text{Eq. 6}$$

The value for element $g_1$ is then determined according to Equation 7, as shown below.

$$g_1 = \frac{2 \cdot a_1}{\gamma} \qquad \text{Eq. 7}$$

The values for elements $g_2$ through $g_n$ are determined according to Equation 8.

$$g_k = \frac{4 \cdot a_{k-1} \cdot a_k}{b_{k-1} \cdot g_{k-1}}, \qquad \text{Eq. 8}$$

where $$k = 2 \ldots n$$

Finally, values for the element $g_{n+1}$ is calculated. If n is an odd value, the gain is calculated according to Equation 9. Conversely, if n is an even value, the gain is calculated according to Equation 10.

$$g_{n+1} = 1 (\text{for } n = \text{odd}) \qquad \text{Eq. 9}$$

$$g_{n+1} = \coth^2\left[\frac{\beta}{4}\right] \qquad \text{Eq. 10}$$

With values $g_0$ through $g_{n+1}$ calculated according to the method illustrated above, the low-pass prototype filter is fully defined and all its component values are known. It is then possible to utilize the values determined above to identify the attributes of a corresponding high-pass filter exhibiting the desired phase shift.

Figure 8:
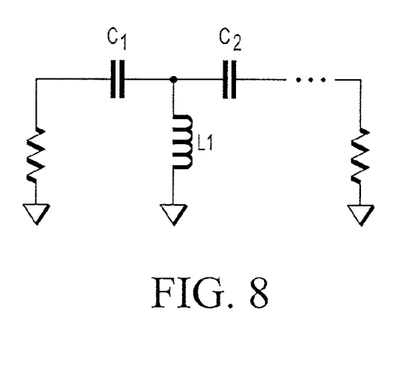
FIG. 8 depicts a third order high-pass filter network designed using the low-pass prototype filter of FIG. 7.

FIG. 8 shows an example high-pass filter that can be designed using the values calculated using the prototype low-pass filter of FIG. 6. As shown in FIG. 8, the filter includes a shunt inductor, though it will be apparent to a person of ordinary skill in the art that the filter could be implemented with two shunt inductors with a series capacitor placed between the two inductors as illustrated in 608. The example provided below relates to an example third order filter, but it will be apparently that a similar approach may be used to design an $n^{th}$ order filter. Using the gain values calculated above for the prototype filter, therefore, it is possible to calculate capacitance and inductance values for $C_1$, $L_1$, and $C_2$ of FIG. 7 according to Equations 11-13, below.

$$C_1 = \frac{1}{\omega_0' \cdot g_1 \cdot K} \qquad \text{Eq. 11}$$

$$L_1 = \frac{K}{\omega_0' \cdot g_2} \qquad \text{Eq. 12}$$

$$C_2 = \frac{1}{\omega_0' \cdot g_3 \cdot K} \qquad \text{Eq. 13}$$

In Equations 11-13, $\omega_0'$ is a value scaled to the amount of desired phase shift at the amplifier's anticipated operating frequency. The design of the high-pass filter may be constrained such that $\omega_0'$ is less than the amplifier's operating frequency. K is the desired impedance of the resulting filter (e.g., 50 ohms).

Using these techniques, therefore, it is possible to design a high pass filter exhibiting a desired phase shift. That high pass filter can then be implemented within the phase advance network of the present disclosure, such as phase advance network 516 of FIG. 5 to reduce phase delay by a desired amount on the corresponding amplifier path.

To further illustrate, an example is provided in which the following values may be utilized in designing the phase advance network filter illustrated in FIG. 8:

K=50 ohms, where $\omega_0'$, the cutoff frequency for the high pass filter, is chosen for a given target phase shift $\phi$ The amplifier device's center frequency is selected to be 1 gigahertz (GHz) and n is set to 3 (resulting in a third order filter). The Chebychev response is then determined setting $L_{AR}$ equal to 0.01 dB (resulting in 27 dB return loss).

With those input values, it is possible using the methods described above to calculate capacitance values for capacitors $C_1$ and $C_2$ and an inductance value for inductor $L_1$ for the third order filter. In this example, values for components $C_1$, $C_2$ and $L_1$ as well as the amount of phase advance achieved by the phase advance network are calculated for a range of frequencies $\omega_0'$.

The results for the present example are shown in Table 2, below. The first column shows the cutoff frequency of the filter (where $\omega = 2\pi f$), the second column shows the phase advance achieved by the filter, the third column shows component values for the filter's capacitors, and the fourth column shows component values for the filter's inductors. Referring to the first row, for a given filter cutoff frequency of 0.079 GHz, the filter component values show that each capacitor $C_1$ and $C_2$ should have a capacitance of 62.2 picofarads (pF) and the inductor $L_1$ should have an inductance of 102 nanohenries (nH). With the filter so configured, the phase advance achieved by the phase advance network would be approximately 5 degrees at 1 GHz. Conversely, referring to the last row of the table, for a given frequency of 0.915 GHz, the filter components values show that each capacitor $C_1$ and $C_2$ should have a capacitance of 5.5 picofarads (pF) and the inductor $L_1$ should have an inductance of 9 nanohenries (nH). With the filter so configured, the phase advance achieved by the phase advance network would be approximately 60 degrees at 1 GHz.

TABLE 2

| $f_o$ - GHz | Φ - Deg | C - pF | L - nH |
|---|---|---|---|
| 0.079 | 5 | 62.2 | 102 |
| 0.159 | 10 | 31.6 | 51.2 |
| 0.237 | 15 | 21 | 31.1 |
| 0.315 | 20 | 15.8 | 25.6 |
| 0.394 | 25 | 12.8 | 20.7 |
| 0.471 | 30 | 10.6 | 17.3 |
| 0.549 | 35 | 9.2 | 14.9 |
| 0.624 | 40 | 8.1 | 13.1 |
| 0.699 | 45 | 7.2 | 11.7 |
| 0.773 | 50 | 6.6 | 10.7 |
| 0.845 | 55 | 6 | 9.7 |
| 0.915 | 60 | 5.5 | 9 |

With the component values in Table 2 calculated, for a given amplifier implementation requiring a desired phase shift in the phase advance network, a suitable high pass filter can be created and implemented within a target amplifier.

Figure 9:
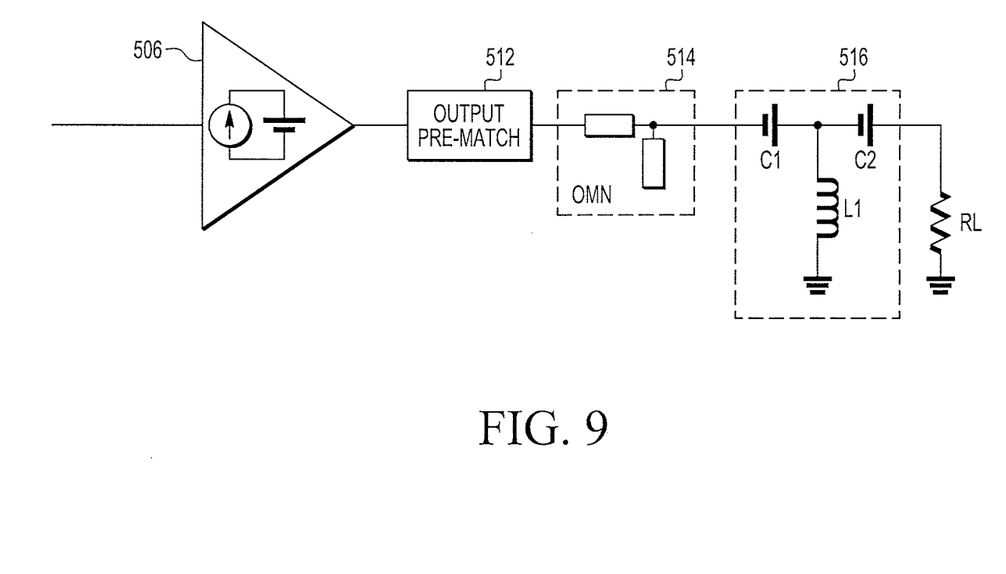
FIG. 9 shows the carrier path of the amplifier of FIG. 5 where the phase advance network is implemented as the third order high pass filter of FIG. 8.

To illustrate, a third order filter may be implemented within a phase advance network, as shown in FIG. 9. FIG. 9 depicts the carrier path of the amplifier of FIG. 5 where the phase advance network is implemented as the third order high pass filter of FIG. 8. Again, given the phase delay attributes of components such as output pre-match circuit 512 and output matching network 514, the desired phase advance provided by phase advance network 516 can be identified, which, in turn, can be used to identified the component values for capacitors $C_1$ and $C_2$ and inductor $L_1$.

Within the circuit illustrated in FIG. 9, amplifier 506 may be implemented as a high-power transistor. In that case, output pre-match circuit 512 may be implemented within the same package (e.g., over the same printed circuit board (PCB)) as the transistor implementing amplifier 506. In some embodiments, output matching network 514 may be implemented outside the package, with a connected bias network (not shown). Inductor $L_1$ may be implemented as a short circuit transmission line stub within the printed circuit board.

In other embodiments, using the methods described herein, different high-pass filters may be designed and implemented within phase advance network 516. For example, filters of different orders (e.g., second, third, fourth or other order filters—see FIGS. 6A-6C for examples) could be designed and implemented within a phase advance network to achieve a particular desired phase advance configured to offset or compensate for phase delays occurring within other components of the amplifier path.

Figure 10A:
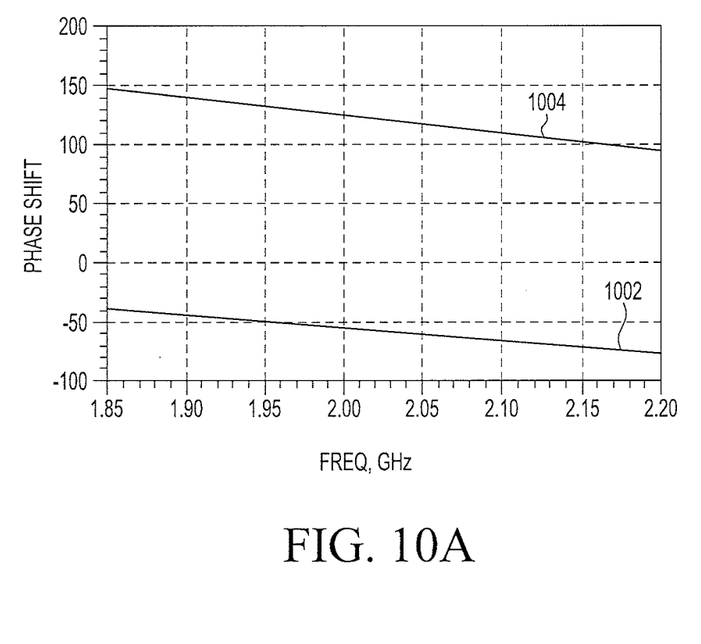
FIGS. 10A and 10B show simulation results for amplifiers implementing phase advance networks configured in accordance with the present disclosure.
Figure 10B:
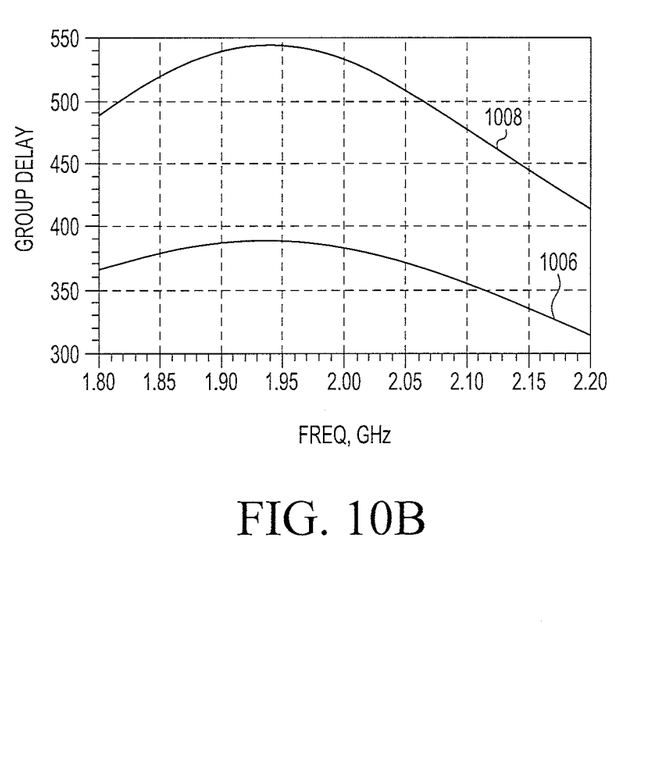

FIGS. 10A and 10B show simulation results for Doherty amplifiers implementing phase advance networks configured in accordance with the present disclosure.

FIG. 10A illustrates the phase shift through the carrier path for a Doherty amplifier plotted against frequency. Line 1004 shows the phase shift through the carrier path (for elements 314 & 316) for a conventional Doherty amplifier, while line 1002 shows the phase shift through the carrier path (for elements 514 & 516) for a Doherty amplifier incorporating the present phase advance network. As illustrated by FIG. 10A, the phase shift for the amplifier incorporating the phase advance network is approximately 180 degrees less than that of the conventional device.

FIG. 10B illustrates the group delay for an amplifier plotted against frequency for an example amplifier. In FIG. 10B, line 1008 represents the group delay in an amplifier having a conventional Doherty configuration (elements 314 & 316), while line 1006 represents the group delay in an amplifier (elements 514 & 516) incorporating the present phase advance network. As illustrated in FIG. 10B, in the amplifier incorporating the present phase advance network a 30-40% reduction in group delay is observed.

Taken together, the reduction in phase shift and group delay observed in the amplifier device incorporating the present phase advance network can result in improved bandwidth performance for the amplifier incorporating the phase advance network. Additionally, the reduce in phase shift may enable an amplifier design to incorporate a carrier path having a length of $\lambda/4$, reducing the need for additional transmissions to be connected to the carrier path to achieve a length of $n*\lambda/4$, where n is greater than 1.

For the sake of brevity, conventional techniques related to Doherty amplifiers, load modulation, impedance matching, integrated circuit design and/or fabrication, transistor design and/or fabrication, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Reference herein to directional relationships, such as top and bottom or left and right, refer to the relationship of the components in the orientation illustrated in the drawings, which may not be the orientation of the components in all uses of the apparatus being described. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "substantial" and "substantially" herein mean sufficient to accomplish the stated purpose in a practical manner and that minor imperfections, if any, are not significant for the stated purpose.

In conclusion, systems, devices, and methods configured in accordance with example embodiments of the invention relate to:

A device including a Doherty amplifier having a carrier path and a peaking path. The carrier path includes a carrier amplifier configured to amplify a signal received from an input to the Doherty amplifier, an output matching network, the output matching network exhibiting a phase delay during operation of the Doherty amplifier, and a phase advance network connected to the output matching network and configured to offset at least a portion of the phase delay of the output matching network.

In another embodiment, a semiconductor package includes a carrier amplifier connected to a first output of a power divider, and a first output matching network connected to the carrier amplifier and an output combining node. The first output matching network exhibits a phase delay during operation of the carrier amplifier. The semiconductor package includes a phase advance network connected to the first output matching network. The phase advance network is configured to offset at least a portion of the phase delay of the first output matching network. The semiconductor package includes a peaking amplifier connected to a second output of the power divider and the output combining node, and a second output matching network connected to the peaking amplifier.

In another embodiment, a device includes a first amplifier path connected to a first output of a power divider, a phase advance network coupled to the first amplifier path, the phase advance network being configured to offset at least a portion of a phase delay of a component connected to the first amplifier path, and a second amplifier path connected to a second output of the power divider.

The foregoing description was primarily directed to preferred embodiments of the invention. Although some attention was given to various alternatives within the scope of the invention, it is anticipated that one skilled in the art will likely realize additional alternatives that are now apparent from disclosure of embodiments of the invention. Accordingly, the scope of the invention should be determined from the following claims and not limited by the above disclosure.

What is claimed is:

1. A device, comprising:
  a Doherty amplifier having a carrier path and a peaking path, the carrier path including:
    a carrier amplifier configured to amplify a signal received from an input to the Doherty amplifier, the carrier amplifier having only a single output,
    an output pre-match circuit connected directly to the single output of the carrier amplifier, the output pre-match circuit exhibiting a phase delay,
    an output matching network connected directly to an output of the output pre-match circuit, the output matching network exhibiting a phase delay during operation of the Doherty amplifier, the phase delay of the output matching network being greater than zero and less than $\lambda$ where $\lambda$ is a wavelength of an operating frequency of the Doherty amplifier, the output matching network having a single output, and
    a phase advance network connected directly to the single output of the output matching network and a combining node of the Doherty amplifier, the phase advance network exhibiting a phase advance configured to offset at least a portion of the phase delay of the output pre-match circuit and the phase delay of the output matching network, wherein a combination of the phase delay of the output pre-match circuit, the phase delay of the output matching network, and the phase advance of the phase advance network results in a phase delay on the carrier path of 90 degrees.

2. The device of claim 1, wherein the phase advance network includes a high-pass filter.

3. The device of claim 2, wherein the high-pass filter is configured as a shunt-inductive network.

4. The device of claim 2, wherein a cutoff frequency of the high-pass filter is less than an operating frequency of the Doherty amplifier.

5. The device of claim 1, wherein the Doherty amplifier is configured as an inverted Doherty amplifier.

6. The device of claim 1, wherein the carrier amplifier and the phase advance network are in the same package.

7. A semiconductor package, comprising:
  a carrier amplifier connected to a first output of a power divider, the carrier amplifier having a single output connected to a carrier path;
  a first output matching network connected to the single output of the carrier amplifier and an output combining node, the first output matching network exhibiting a phase delay during operation of the carrier amplifier, the phase delay of the first output matching network being greater than zero and less than $\lambda$ where $\lambda$ is a wavelength of an operating frequency of the semiconductor package, the output matching network having a single output;
  a phase advance network connected to the single output of the first output matching network, the phase advance network being configured to offset at least a portion of the phase delay of the first output matching network so that a phase delay of the carrier path is approximately 90 degrees;
  a peaking amplifier connected to a second output of the power divider and the output combining node; and
  a second output matching network connected to the peaking amplifier.

8. The semiconductor package of claim 7, wherein the phase advance network includes a high-pass filter.

9. The semiconductor package of claim 8, wherein the high-pass filter is configured as a shunt-inductive network.

10. The semiconductor package of claim 8, wherein a cutoff frequency of the high-pass filter is less than an operating frequency of the carrier amplifier.

11. The semiconductor package of claim 7, wherein the carrier amplifier and the peaking amplifier are in an inverted Doherty amplifier configuration.

12. A device, comprising:
  a first amplifier path connected to a first output of a power divider, the first amplifier path including a first amplifier having a single output;
  a phase advance network coupled to the first amplifier path between the first amplifier and an output combining node connected to the first amplifier path, the phase advance network being configured to offset at least a portion of a phase delay of a component connected to the first amplifier path, wherein the phase delay of the component connected to the first amplifier path is greater than zero and less than $\lambda$ where $\lambda$ is a wavelength of an operating frequency of the device and a phase delay of the first amplifier path is approximately 90 degrees; and a second amplifier path connected to a second output of the power divider and the output combining node.

13. The device of claim 12, wherein the phase advance network includes a high-pass filter.

14. The device of claim 13, wherein the high-pass filter is configured as a shunt-inductive network.

15. The device of claim 13, wherein a cutoff frequency of the high-pass filter is less than an operating frequency of an amplifier connected to the first amplifier path.

16. The device of claim 12, wherein the first amplifier path and the second amplifier path are in an inverted Doherty amplifier configuration.

* * * * *